US008716928B2

(12) United States Patent
Kim et al.

(10) Patent No.: US 8,716,928 B2
(45) Date of Patent: May 6, 2014

(54) ORGANIC LIGHT EMITTING DEVICE WITH A LOW-RESISTANCE CATHODE

(75) Inventors: Yong-Tak Kim, Yongin (KR); Won-Jong Kim, Yongin (KR); Joon-Gu Lee, Yongin (KR); Jin-Baek Choi, Yongin (KR); Chang-Ho Lee, Yongin (KR); Il-Soo Oh, Yongin (KR); Hee-Ju Ko, Yongin (KR); Se-Jin Cho, Yongin (KR); Jin-Young Yun, Yongin (KR); Hyung-Jun Song, Yongin (KR); Kyu-Hwan Hwang, Yongin (KR); Jong-Hyuk Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 12/756,887

(22) Filed: Apr. 8, 2010

(65) Prior Publication Data
US 2010/0301741 A1 Dec. 2, 2010

(30) Foreign Application Priority Data
Jun. 1, 2009 (KR) ........................ 10-2009-0048242

(51) Int. Cl.
*H05B 33/00* (2006.01)
*H01J 1/62* (2006.01)
(52) U.S. Cl.
USPC .......................................... 313/504; 313/506
(58) Field of Classification Search
USPC .......................................... 313/504, 506, 512
See application file for complete search history.

(56) References Cited

U.S. PATENT DOCUMENTS

| 6,025,894 A | 2/2000 | Shirasaki et al. |
| 2002/0036297 A1 | 3/2002 | Pichler |
| 2005/0052118 A1 | 3/2005 | Lee et al. |
| 2005/0088082 A1 | 4/2005 | Morita et al. |

(Continued)

FOREIGN PATENT DOCUMENTS

| CN | 101006593 A | 7/2007 |
| CN | 101212025 A | 7/2008 |

(Continued)

OTHER PUBLICATIONS

Hsu, S-F, et al: "4.2: Highly Efficient Top-Emitting White Organic Electroluminescent Devices." 2005 SID International Symposium Digest of Technical Papers. May 24, 2005; pp. 32-35, XP001244148, cited in the Extended European Search Report issued by the European Patent Office on Sep. 23, 2010 corresponding to European Patent No. 10164583.6-1235.

(Continued)

*Primary Examiner* — Joseph L Williams
(74) *Attorney, Agent, or Firm* — Robert E. Bushnell, Esq.

(57) ABSTRACT

Provided is an organic light emitting device including an anode, a cathode, and a light emitting layer disposed between the anode and the cathode, wherein the cathode has a structure including a first metal layer and a second metal layer, or a structure including a first metal layer, a second metal layer, and one selected from the group consisting of an oxide layer, a nitride layer, and a nitric oxide layer, and wherein the cathode has low resistance.

11 Claims, 5 Drawing Sheets

(56) References Cited

U.S. PATENT DOCUMENTS

| | | | |
|---|---|---|---|
| 2005/0208330 A1* | 9/2005 | Raychaudhuri et al. | 428/690 |
| 2006/0251924 A1* | 11/2006 | Lu et al. | 428/690 |
| 2007/0126352 A1 | 6/2007 | Okutani | |
| 2008/0037094 A1 | 2/2008 | Hwang et al. | |
| 2008/0042550 A1 | 2/2008 | Matsuura et al. | |
| 2008/0067927 A1* | 3/2008 | Hanawa et al. | 313/504 |
| 2008/0157663 A1 | 7/2008 | Sung et al. | |
| 2008/0164809 A1* | 7/2008 | Matsunami et al. | 313/504 |
| 2008/0218069 A1 | 9/2008 | Kim et al. | |
| 2008/0238297 A1* | 10/2008 | Oota | 313/500 |
| 2008/0241561 A1* | 10/2008 | Jeong et al. | 428/472 |
| 2008/0265751 A1* | 10/2008 | Smith et al. | 313/504 |
| 2008/0315763 A1 | 12/2008 | Dobbertin et al. | |
| 2009/0011278 A1 | 1/2009 | Choi et al. | |
| 2009/0079335 A1* | 3/2009 | Mitsuya et al. | 313/504 |
| 2009/0251045 A1 | 10/2009 | Bettinelli et al. | |

FOREIGN PATENT DOCUMENTS

| | | |
|---|---|---|
| CN | 101262043 A | 9/2008 |
| CN | 101340749 A | 1/2009 |
| EP | 1968133 A2 | 9/2008 |
| JP | 2002-170665 A | 6/2002 |
| JP | 2003-59672 A | 2/2003 |
| JP | 2003059672 A | 2/2003 |
| JP | 2005135624 | 5/2005 |
| JP | 2008-015293 A | 1/2008 |
| JP | 2008-046637 A | 2/2008 |
| JP | 2008-513931 A | 5/2008 |
| JP | 2008-166283 A | 7/2008 |
| JP | 2008218415 | 9/2008 |
| JP | 2008-270812 A | 11/2008 |
| KR | 10-2007-0043293 A | 4/2007 |
| WO | 0157904 A1 | 8/2001 |
| WO | 2006033312 A1 | 3/2006 |
| WO | 2007096538 A2 | 8/2007 |

OTHER PUBLICATIONS

Extended European Search Report issued by the European Patent office on Sep. 23, 2010, corresponding to European Patent No. 10164583.6-1235.

Korean Office action issued by Korean Industrial Property Office on Aug. 26, 2011, corresponding to KR 10-2009-0048242 and Request for Entry attached herewith.

Japanese Office Action issued on Nov. 1, 2011 in connection with Japanese Patent Application Serial No. 2010-114070, which also claims Korean Patent Application Serial No. 10-2009-0048242 as its priority document, and Request for Entry of the Accompanying Office Action attached herewith.

Korean Registration Determination Certificate issued on May 7, 2012 by the Korean Intellectual Property Office for the corresponding Korean application.

S.L. Lai et al., Applications of Ytterbium in organic light-emitting device as high performance and transparent electrodes, Chemical Physics Letters, Elsevier Science B.V., Sep. 20, 2002, 366, p. 128-133.

Japanese Office Action issued by Japanese Patent Office on Feb. 5, 2013 (Japanese Patent Application No. 2010-114070), corresponding to Korean Patent Application No. 10-2009-0048242 and Request for Entry of the Accompanying Office Action attached herewith.

Taiwanese Office Action issued by the Taiwan Patent Office on Sep. 23, 2013 in the examination of the Taiwanese Patent Application No. 099115921, which corresponds to KR10-2009-0048242 and Request for Entry of the Accompanying Office Action attached herewith.

Chinese Office Action issued by the Chinese Patent Office on Nov. 15, 2013 in the examination of the Chinese Patent Application No. 201010182481.4, which corresponds to KR10-2009-0048242 and Request for Entry of the Accompanying Office Action attached herewith.

Japanese Office Action issued by the Japanese Patent Office on Feb. 18, 2014 in the examination of the Japanese Patent Application No. 2010-114070, which corresponds to KR 10-2009-0048242 and Request for Entry of the Accompanying Office Action attached herewith.

* cited by examiner

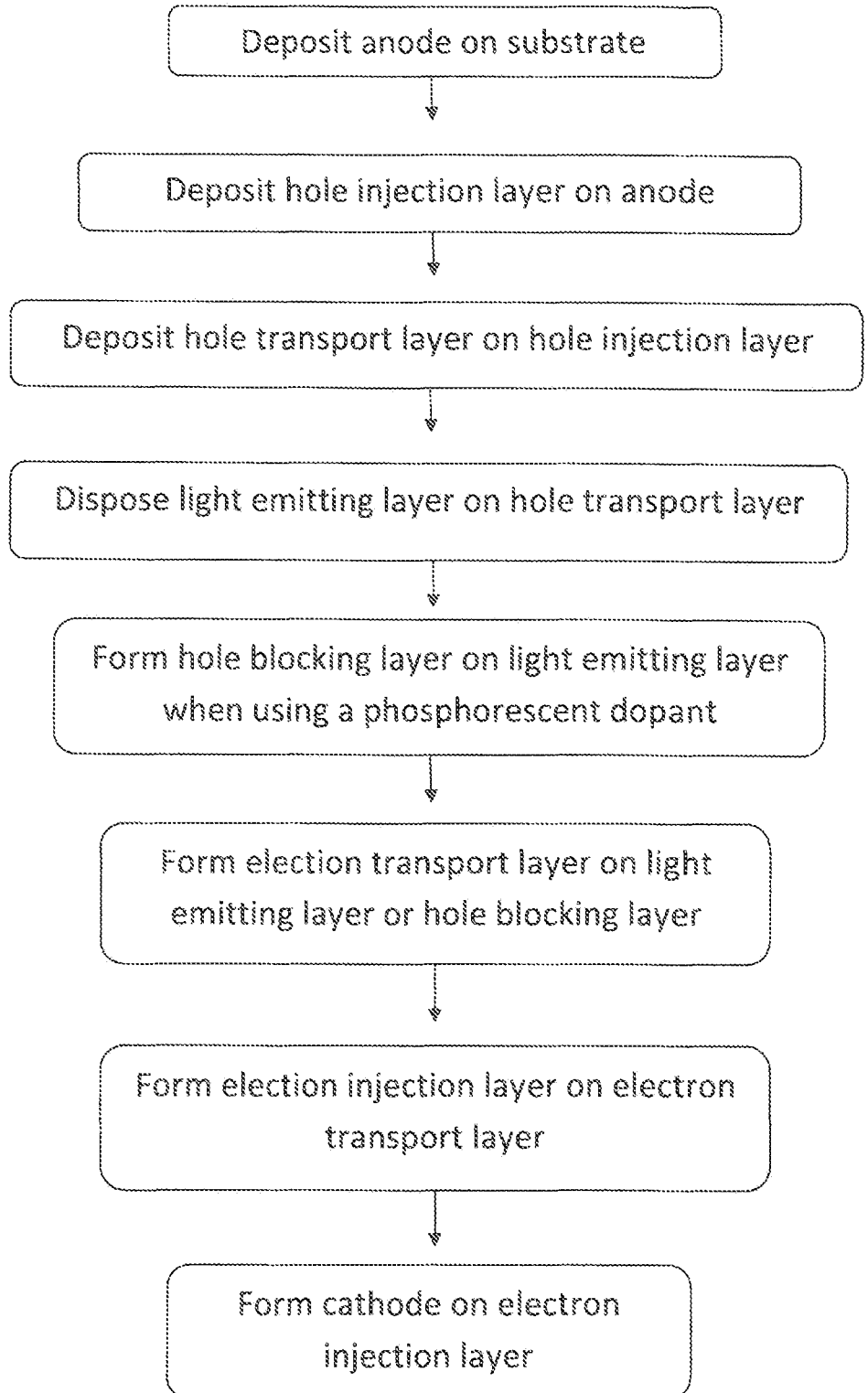

ORGANIC LIGHT EMITTING DEVICE WITH A LOW-RESISTANCE CATHODE

CROSS-REFERENCE TO RELATED PATENT APPLICATION

This application claims the benefit of Korean Patent Application No. 10-2009-0048242, filed on Jun. 1, 2009, in the Korean Intellectual Property Office, the disclosure of which is incorporated herein in its entirety by reference.

BACKGROUND OF THE INVENTION

1. Field of the Invention

The present invention relates to an organic light emitting device that includes an anode, a cathode, and a light emitting layer disposed between the anode and the cathode, wherein the cathode includes a plurality of metal layers.

2. Description of the Related Art

With the advent of the $21^{st}$ century, the trend toward an information-oriented society has been accelerated, and along with a necessity for receiving and transmitting information anytime anywhere conventional cathode-ray tube (CRT) displays are being replaced with flat panel displays. One of the most common types of flat panel displays currently used are liquid crystal displays (LCD). This is because LCDs are lightweight and have low power consumption. However, since a LCD is not a self-light emitting device but a light receiving and emitting device, the LCD has technical limitations in terms of contrast ratio, a viewing angle, and area size. Accordingly, new flat panel displays that can overcome such technical limitations are being developed worldwide. One such new flat panel display is an organic light emitting diode (OLED). The OLED can be driven at low power, has a wide viewing angle and quick response speed, and is self-light emitting, light weight, and thin. Accordingly, was of OLEDs is being increased in Japan, Korea, and the US.

A cathode of an active matrix organic light emitting device (AMOLED) used in current mobile displays is formed of a composition including magnesium (Mg) and silver (Ag), but when the AMOLED has a size of 14" or larger, a lower resistance is required. In this regard, an IR drop phenomenon occurs in AMOLEDs of 14" or larger when the cathode is formed of Mg and Ag.

SUMMARY OF THE INVENTION

The present invention provides an organic light emitting device that includes an anode, a cathode, and a light emitting layer disposed between the anode and the cathode, wherein the cathode has a structure including a first metal layer and a second metal layer, or a structure including a first metal layer, a second metal layer, and one selected from the group consisting of an oxide layer, a nitride layer, and a nitric oxide layer, and wherein the cathode has low resistance.

According to an aspect of the present invention, there is provided an organic light emitting device including: an anode; a cathode; and a light emitting device disposed between the anode and the cathode, wherein the cathode has a structure including a first metal layer and a second metal layer, or a structure including a first metal layer, a second metal layer, and one selected from the group consisting of an oxide layer, a nitride layer, and a nitric oxide layer.

The second metal layer may include a metal having a resistance in a range of 0.1 to 10 ohm/sq, and the first metal layer may include an alloy of a metal having a work function in a range of about 3.5 to about 4.5 eV, and Ag.

The second metal layer may include a metal having a resistance in a range of 0.5 to 3 ohm/sq, and the first metal layer may include an alloy of a metal having a work function in a range of about 3.5 to about 4.0 eV and Ag.

The second metal layer may include Ag, Al, Cu, or Cr, and the metal layer may comprise an alloy of Ag and a metal selected from the group consisting of Yb, Sm, Sr, Cs, Ru, Ba, Pr, Nd, Pm, Eu, Tb, Dy, Ho, Er, Tm, Ac, Th, Pa, U, Np, Pu, Am, Cm, Bk, Cf, Es, Fm, Md, and No.

The second metal layer may include Ag or Al, and the first metal layer may include an alloy of Ag, and a metal which is Yb, La, Y, Sm, Ba, or Sr.

The second metal layer may include Ag, and the first metal layer may include an alloy of Ag and Yb.

A weight ratio of the metal to Ag in the first metal layer may be approximately 0.1:1 to approximately 15:1.

A weight ratio of the metal to Ag in the first metal layer may be approximately 4:1 to approximately 10:1.

The first metal layer may have a thickness in a range of about 30 Å to about 300 Å.

The first metal layer may have a thickness in a range of about 60 Å to about 100 Å.

The second metal layer may have a thickness in a range of about 50 Å to about 500 Å.

The second metal layer may have a thickness in a range of about 100 Å to about 300 Å.

The refractive index of the oxide layer, the nitride layer, or the nitric oxide layer may be in a range of about 1.5 to about 2.5.

The refractive index of the oxide layer, the nitride layer, or the nitric oxide layer may be in a range of about 1.7 to about 2.2.

The thickness of the oxide layer, the nitride layer, or the nitric oxide layer may be in a range of about 100 Å to about 1500 Å.

The thickness of the oxide layer, the nitride layer, or the nitric oxide layer may be in a range of about 300 Å to about 700 Å.

The oxide layer may include at least one selected from the group consisting of $MoO_x$, $Al_2O_3$, $Sb_2O_3$, BaO, CdO, CaO, $Ce_2O_3$, CoO, $Cu_2O$, DyO, GdO, HfO, $La_2O_3$, $Li_2O$, MgO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, and ZrO, wherein x is in a range of 2 to 4.

The nitride layer may include at least one selected from the group consisting of AlN, BN, NbN, SiN, TaN, TiN, VN, YbN, and ZrN.

The nitric oxide layer may include SiON or AlON.

BRIEF DESCRIPTION OF THE DRAWINGS

The above and other features and advantages of the present invention will become more apparent by describing in detail exemplary embodiments thereof with reference to the attached drawings in which:

FIG. 7 is a flow chart showing one embodiment of a manufacturing process for the organic light emitting device of present invention.

DETAILED DESCRIPTION OF THE INVENTION

Hereinafter, the present invention will be described more fully with reference to the accompanying drawings, in which exemplary embodiments of the invention are shown.

An organic light emitting device (OLED) according to an embodiment of the present invention includes an anode, a cathode, and a light emitting layer disposed between the anode and the cathode, wherein the cathode has a structure including a first metal layer and a second metal layer, or a structure including a first metal layer, a second metal layer, and one selected from the group consisting of an oxide layer, a nitride layer, and a nitric oxide layer.

Figure 1A:
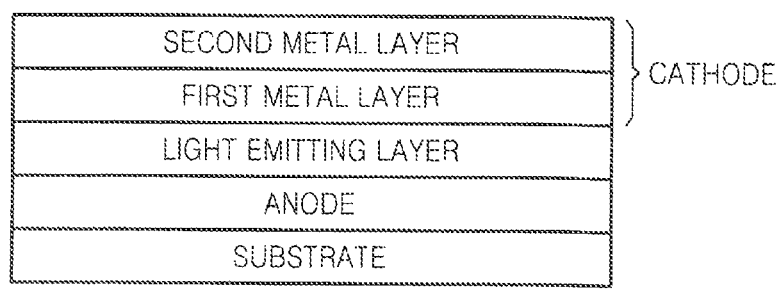
FIG. 1A is a diagram schematically illustrating a structure of an organic light emitting device according to an embodiment of the present invention.

FIG. 1A is a diagram schematically illustrating a structure of an organic light emitting device according to an embodiment of the present invention.

Cathodes of organic light emitting devices used in currently available mobile displays are usually formed of a composition including magnesium (Mg) and silver (Ag), and the size of the cathodes is in a range of 2" to 3". Accordingly, the cathodes do not cause an IR drop and have a high viewing angle. However, if the cathodes are applied to large displays having a size of 14" or greater, the cathodes have relatively high resistance due to their Mg/Ag composition. Accordingly, an IR drop of about 40 ohm/sq occurs and the viewing angle decreases, and thus transmissivity decreases as the wavelength increases. Thus, the red viewing angle needs to be compensated. In order to compensate the red viewing angle, Ag may be deposited to form a second layer so as to complement the low resistance in the first layer, wherein the cathode may have a double-layer structure including a first layer formed of Mg and Ag, and a second layer formed of Ag. Here, characteristic analysis is performed according to the ratio of Mg to Ag in a single layer Mg/Ag electrode, and characteristic analysis is performed according to thicknesses of the two layers in a double-layer (Mg/Ag)/Ag electrode. However, the thickness of the single layer Mg/Ag electrode is relatively small, and thus a process margin and layer uniformity are still low.

Referring to FIG. 1A, the organic light emitting device according to the present embodiment includes an anode, a cathode, and a light emitting layer disposed between the anode and the cathode. The cathode has a structure consisting of a first metal layer and a second metal layer, wherein the first metal layer is disposed on the light emitting layer and the second metal layer is disposed on the first metal layer.

According to an embodiment of the present invention, the second metal layer may be formed of a metal having a resistance in a range of 0.1 to 10 ohm/sq, and the first metal layer may be formed of an alloy of a metal having a work function in a range of about 3.5 to about 4.5 eV, and Ag.

When the first metal layer disposed on the light emitting layer is formed of an alloy of a metal having a work function in a range of about 3.5 to about 4.5 eV, and Ag, red compensation is not required since emission is largely unaffected. Transmission is good in the visible region, and the plot line in a transmissivity graph is basically straight since the deviation of transmissivity is low.

The second metal layer disposed on the first metal layer has a low resistance in the range of 0.1 to 10 ohm/sq, and thus complements the first metal layer which also has a low resistance.

According to such a structure of the cathode, the cathode has low resistance since the first metal layer performs emission and the second metal layer lowers the resistance.

When the work function of the metal in the first metal layer exceeds 4.5 eV, the driving voltage of the OLED may increase and efficiency may decrease.

Meanwhile, when the resistance of the second metal exceeds 10 ohm/sq, a driving voltage of the OLED may increase and efficiency may decrease.

According to an embodiment of the present invention, a metal of the second metal layer may have a resistance in a range of 0.5 to 3 ohm/sq, and an alloy of a metal and Ag of the first metal layer may have a work function in a range of about 3.5 to about 4.0 eV.

According to an embodiment of the present invention, the metal of the second metal layer may be Ag, Al, Cu, or Cr, and the first metal layer may be formed of an alloy of a metal and Ag, wherein the metal is selected from the group consisting of Yb, Sm, Sr, Cs, Ru, Ba, Pr, Nd, Pm, Eu, Tb, Dy, Ho, Er, Tm, Ac, Th, Pa, U, Np, Pu, Am, Cm, Bk, Cf, Es, Fm, Md, and No.

According to an embodiment of the present invention, a metal of the second metal layer may be Ag or Al, and the first metal layer may be formed of an alloy of a metal and Ag, wherein the metal is Yb, La, Y, Sm, Ba, or Sr.

According to an embodiment of the present invention, a metal of the second metal layer may be Ag, and the first metal layer may be formed of an alloy of Ag and Yb.

According to an embodiment of the present invention, a weight ratio of the metal to Ag in the first metal layer may be approximately 0.1:1 to approximately 15:1, and, may be approximately 4:1 to approximately 10:1.

When the weight ratio of the metal to Ag in the first metal layer is greater than 15:1, transmissivity may decrease, the driving voltage of the OLED may increase, and efficiency may decrease.

According to an embodiment of the present invention, the thickness of the first metal layer may be in a range of about 30 to about 300 Å.

When the thickness of the first metal layer is less than 30 Å, a driving voltage of the OLED may increase, and when the thickness of the first metal layer is greater than 300 Å, transmissivity may decrease, and thus efficiency may decrease.

In an embodiment of the present invention, the thickness of the first metal layer may be in a range of about 60 Å to about 100 Å.

According to an embodiment of the present invention, the thickness of the second metal layer may be in a range of about 50 Å to about 500 Å.

When the thickness of the second metal layer is less than 50 Å, the driving voltage of the OLED may increase, and when the thickness of the second metal layer is greater than 500 Å, efficiency may decrease since transmissivity decreases.

According to an embodiment of the present invention, the thickness of the second metal layer may be in a range of about 100 Å to about 300 Å.

Figure 1B:
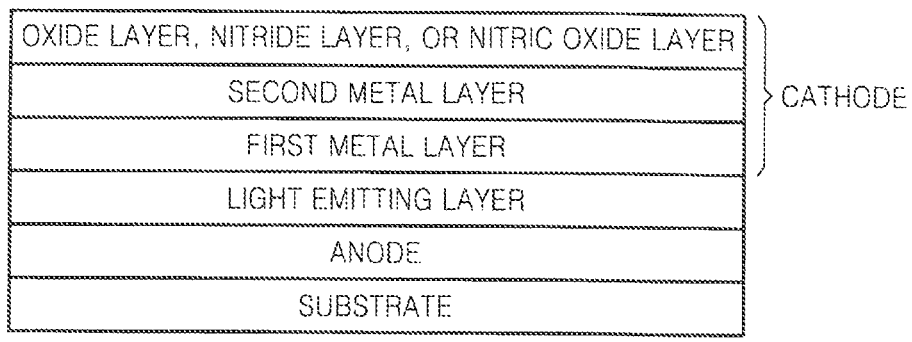
FIG. 1B is a diagram schematically illustrating a structure of an organic light emitting device according to another embodiment of the present invention.

FIG. 1B is a diagram schematically illustrating a structure of an organic light emitting device according to another embodiment of the present invention.

Referring to FIG. 1B, the organic light emitting device according to the current embodiment of the present invention includes an anode, a cathode, and a light emitting layer disposed between the anode and the cathode, wherein the cathode has a structure consisting of a first metal layer, a second metal layer, and one selected from the group consisting of an oxide layer, a nitride layer, and a nitric oxide layer.

The oxide layer, the nitride layer, or the nitric oxide layer forms a capping layer on the second metal layer, and increases the optical characteristics of the organic light emitting device by securing transmissivity.

According to an embodiment of the present invention, the refractive index of the oxide layer, the nitride layer, or the nitric oxide layer may be in a range of about 1.5 to about 2.5.

When the refractive index of the oxide layer, the nitride layer, or the nitric oxide layer is less than 1.5, the thickness of the capping layer may increase, and thus transmissivity may decrease.

According to an embodiment of the present invention, the refractive index of the oxide layer, the nitride layer, or the nitric oxide layer may be in a range of about 1.7 to about 2.2.

According to an embodiment of the present invention, the thickness of the oxide layer, the nitride layer, or the nitric oxide layer may be in a range of about 100 Å to about 1500 Å.

When the thickness of the oxide layer, the nitride layer, or the nitric oxide layer is less than 100 Å, transmissivity may decrease, and thus efficiency may decrease. When the thickness of the oxide layer, the nitride layer, or the nitric oxide layer is greater than 1500 Å, transmissivity may decrease, and thus efficiency may decrease.

According to an embodiment of the present invention, the thickness of the oxide layer, the nitride layer, or the nitric oxide layer may be in a range of about 300 Å to about 700 Å.

According to an embodiment of the present invention, the oxide layer may be formed of at least one selected from the group consisting of $MoO_x$ (x=2~4), $Al_2O_3$, $Sb_2O_3$, BaO, CdO, CaO, $Ce_2O_3$, CoO, $Cu_2O$, DyO, GdO, $HfO_2$, $La_2O_3$, $Li_2O$, MgO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, and ZrO. The oxide layer may be $MoO_x$ (x=2~4), $WO_3$, $Al_2O_3$, NbO, TiO, or YbO.

According to an embodiment of the present invention, the nitride layer may be formed of at least one selected from the group consisting of AlN, BN, NbN, SiN, TaN, TiN, VN, YbN, and ZrN.

According to an embodiment of the present invention, the nitric oxide layer may be formed of SiON or AlON.

Structures of the organic light emitting device according to the present invention will now be described.

The organic light emitting device according to the present invention may have various structures. In this regard, at least one layer selected from the group consisting of a hole injection layer, a hole transport layer, a light emitting layer, a hole blocking layer, an electron transport layer, and an electron injection layer may be disposed between a first electrode and a second electrode.

The organic light emitting device may have a structure including a first electrode, a hole injection layer, a hole transport layer, a light emitting layer, an electron transport layer, an electron injection layer, and a second electrode, or a structure including a first electrode, a hole injection layer, a hole transport layer, a light emitting layer, a hole blocking layer, an electron transport layer, an electron injection layer, and a second electrode.

A method of manufacturing an organic light emitting device having the above structure will now be described.

First, a material for an anode having a high work function is deposited on a substrate using a deposition method or a sputtering method, and the material is used as an anode, i.e. a first electrode. Here, the substrate may be a substrate commonly used in an organic light emitting device. The substrate may be a glass substrate or transparent plastic substrate, which has excellent transparency, surface flatness, easy handling, and waterproofness. The material for an anode may be indium tin oxide (ITO), indium zinc oxide (IZO), tin oxide ($SnO_2$), or zinc oxide (ZnO), which is transparent and has excellent conductivity.

Then, a hole injection layer material is thermally deposited or spin-coated on the anode. Examples of the hole injection layer material include a phthalocyanine compound, such as copper phthalocyanine (CuPc), a starburst type amine derivative, such as TCTA, m-MTDATA, or m-MTDAPB, or a soluble conductive polymer, such as polyaniline/dodecylbenzenesulfonic acid (Pani/DBSA), poly(3,4-ethylenedioxy thiophene)/poly(4-styrenesulfonate) (PEDOT/PSS), polyaniline/camphor sulfonic acid (Pani/CSA), or polyaniline)/poly(4-styrene-sulfonate) (PANI/PSS), but are not limited thereto.

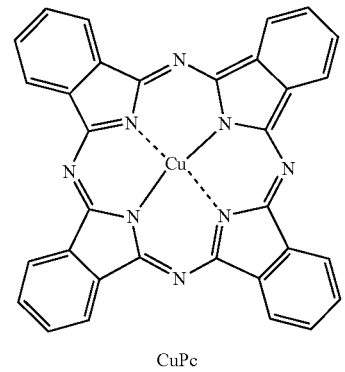

CuPc

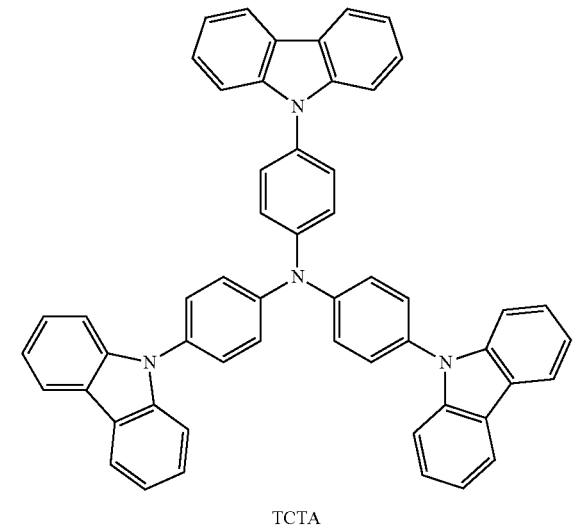

TCTA

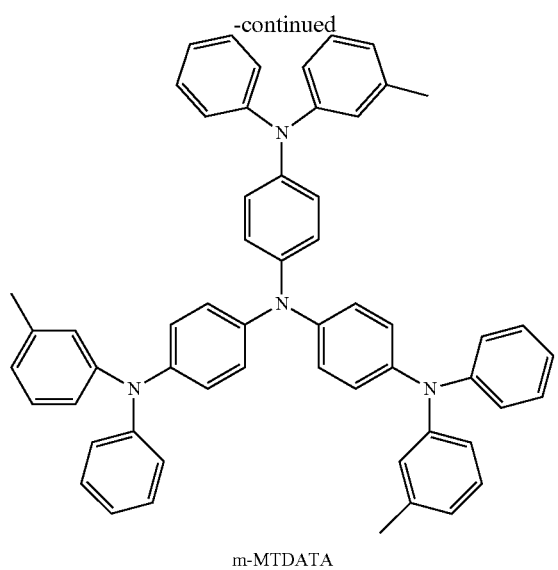

m-MTDATA

Then, a hole transport layer material is vacuum thermally deposited or spin-coated on the hole injection layer so as to form a hole transport layer. Examples of the hole transport layer material include 1,3,5-tricarbazolylbenzene, 4,4'-biscarbazolylbiphenyl, polyvinylcarbazole, m-biscarbazolylphenyl, 4,4'-biscarbazolyl -2,2'-dimethylbiphenyl, 4,4', 4"-tri(N-carbazolyl)triphenylamine, 1,3,5-tri(2-carbazolylphenyl)benzene, 1,3,5-tris(2-carbazolyl-5-methoxyphenyl) benzene, bis(4-carbazolylphenyl)silane, N,N'-bis(3-methylphenyl)-N,N'-diphenyl-[1,1-biphenyl]-4, 4' diamine(TPD), N,N'-di(naphthalene-1-il)-N,N'-diphenyl benzidine(α-NPD), N,N'-diphenyl-N,N'-bis(1-naphthyl)-(1, 1'-biphenyl)-4,4'-diamine (NPB), poly(9,9-dioctylfluorene-co-N-(4-butylphenyl)diphenylamine) (TFB), and poly (9,9-dioctylfluorene-co-bis-(4-butylphenyl-bis-N,N-phenyl-1,4-phenylenediamine) (PFB), but are not limited thereto.

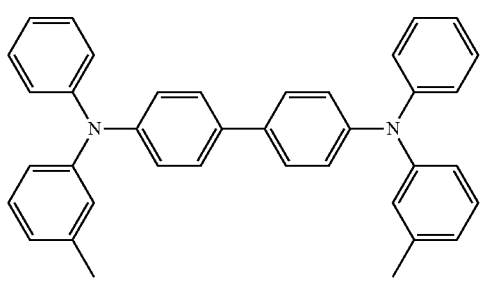

TPD

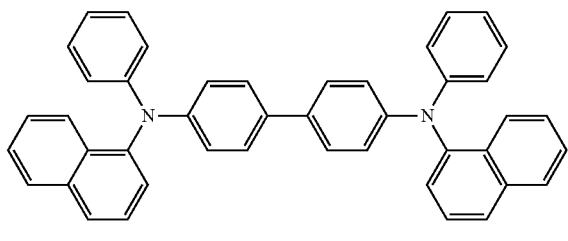

α-NPD

Then, a light emitting layer is disposed on the hole transport layer. A material of the light emitting layer is not specifically limited. The light emitting layer may include a host and a dopant. The host may be 4,4'-biscarbazolylbiphenyl (CBP), TCB, TCTA, SDI-BH-18, SDI-BH-19, SDI-BH-22, SDI-BH-23, dmCBP, Liq. TPBI, Balq, or BCP, and the dopant may be a fluorescent dopant such as IDE102 or IDE105 commercialized by Idemitsu, or a phosphorescent dopant such as Ir(ppy)$_3$ as a well known green phosphorescent dopant or (4,6-F2ppy)$_2$Irpic as a blue phosphorescent dopant. Such a dopant may be vacuum thermally deposited on the hole transport layer together with the host.

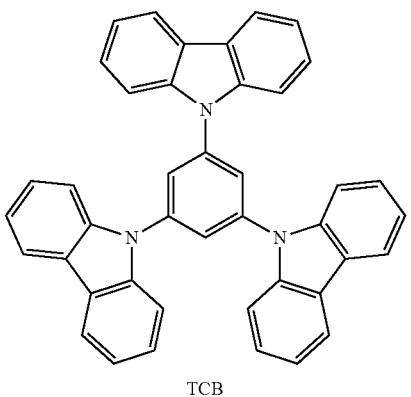

TCB

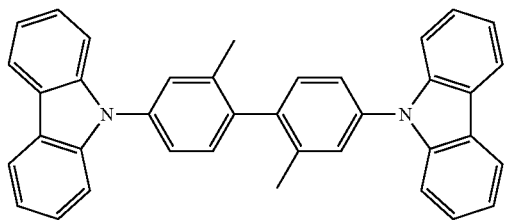

dmCBP

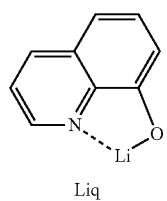

Liq

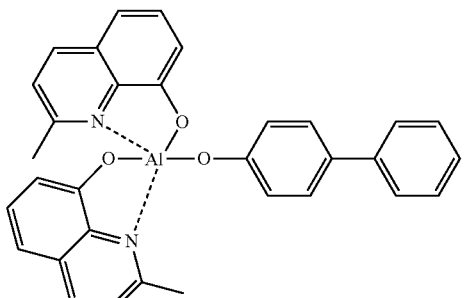

Balq

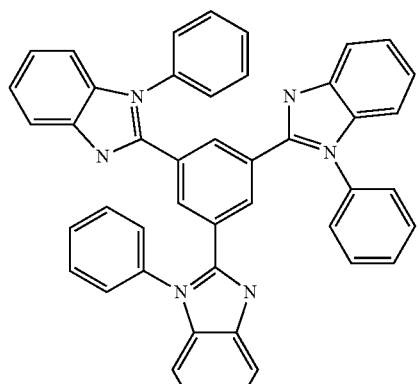

TPBI

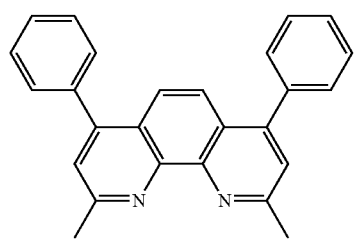

BCP

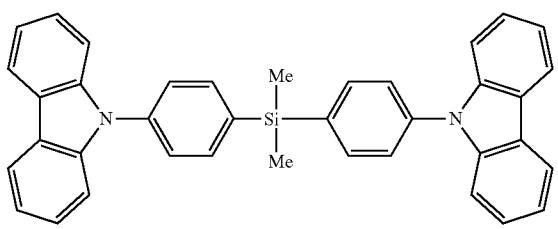

SDI-BH-18

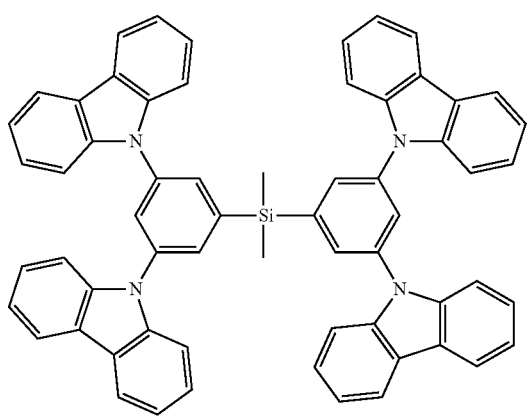

SDI-BH-19

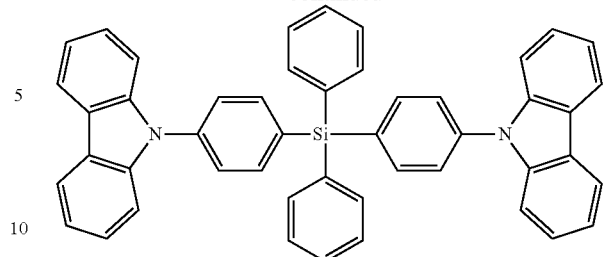

SDI-BH-22

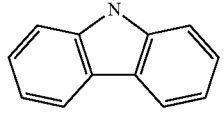

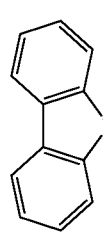

SDI-BH-23

The doping concentration is not specifically limited, but may be in a range of 0.5 to 12 wt %. A thin electron transport layer may be formed on the light emitting layer via a vacuum deposition method or a spin coating method.

Meanwhile, when a phosphorescent dopant is included in the light emitting layer, a hole blocking layer may be additionally formed by vacuum thermal-depositing a hole blocking material on the light emitting layer in order to prevent triplet excitons or holes from diffusing to an electron transport layer. The hole blocking material is not specifically limited, but must have an electron transport capability and a higher ionization potential than a light emitting compound. Examples of the hole blocking material include Balq and BCP.

A thin electron transport layer may be formed on the light emitting layer or the hole blocking layer using a vacuum deposition method or a spin coating method.

The electron transport layer may be formed of Alq3, which is a well-known material.

An electron injection layer may be formed on the electron transport layer. The electron injection layer may be formed of LiF, NaCl, CsF, Li$_2$O, or BaO, but is not limited thereto.

Then, a cathode is formed on the electron injection layer, wherein the cathode has a structure including a first metal layer and a second metal layer, or a structure including a first metal layer, a second metal layer, and one selected from the group consisting of an oxide layer, a nitride layer, and a nitric oxide layer.

The organic light emitting device according to the present invention will be described in greater detail with reference to the following examples. However, these examples are for illustrative purposes only and are not intended to limit the scope of the present invention.

EXAMPLES

Example 1

Comparing Characteristics of First Metal Layers

In order to compare the transmissivity of first metal layers, ytterbium (Yb) and silver (Ag) were vacuum-deposited respectively in weight ratios of 10:1, 5:1, and 1:1 on a glass substrate to form Yb/Ag metal layers.

Mg and Ag were vacuum-deposited on another glass substrate in a weight ratio of 10:1 to form a Mg/Ag layer having a thickness of 170 Å and for comparison with the Yb/Ag layer.

Figure 2:
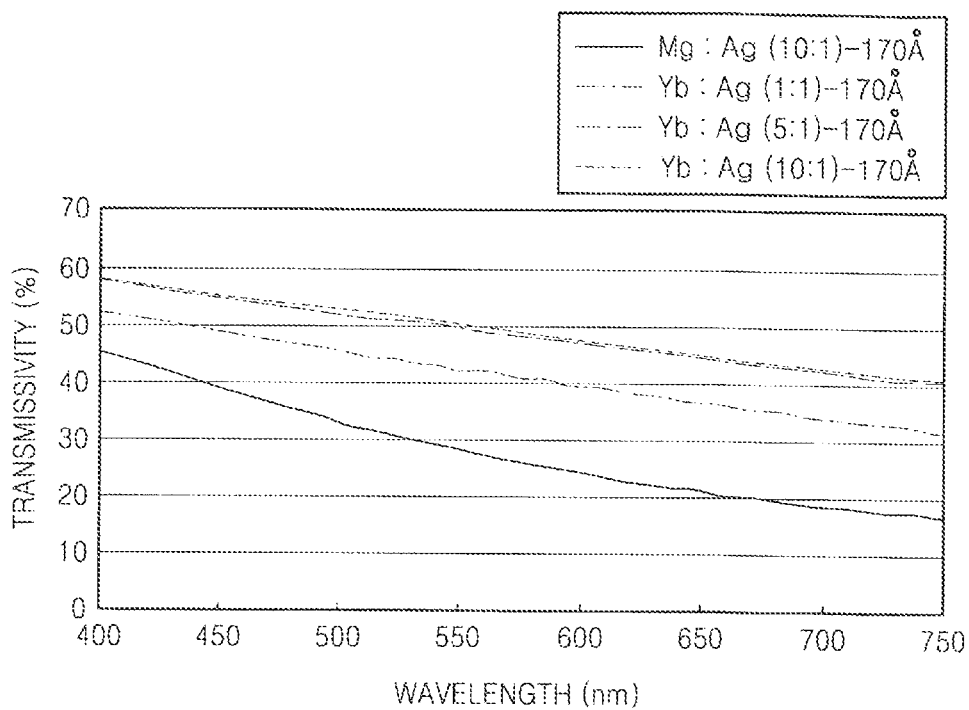
FIG. 2 is a graph showing transmissivity results of Mg/Ag and Yb/Ag layers at the same thickness of 170 Å according to wavelength.

The transmissivity of the Mg/Ag and Yb/Ag layers was compared at the same thickness of 170 Å, and the results of the comparison are shown in FIG. 2. FIG. 2 is a graph showing transmissivity results of the Mg/Ag and Yb/Ag layers at the same thickness of 170 Å according to wavelength. Referring to FIG. 2, at a wavelength of 530 nm, when the amount of Yb in the Yb:Ag layer was changed from 1 to 10, the Mg/Ag layer had 30% transmissivity and the Yb/Ag layer having the weight ratio of 5:1 had 50% transmissivity. Here, the resistance of the Mg/Ag layer was 40 ohm/sq and the resistance of the Yb/Ag layer having the weight ratio of 5:1 was 12 ohm/sq.

Considering most conventional technologies relate to a cathode formed of a Mg/Ag layer, and improving an injection characteristic by adding a buffer layer to the Mg/Ag layer, the above comparison shows that the embodiments of the present invention are qualitatively different from the conventional technologies.

Example 2

Comparing Transmissivity of Cathodes

In order to compare transmissivity of cathodes, Yb and Ag were vacuum-deposited in a weight ratio of 5:1 on a glass substrate to form a Yb/Ag layer having a thickness of 100 Å, and then Ag was vacuum-deposited on the Yb/Ag layer to a thickness of 150 Å so as to form a cathode having a (Yb/Ag)/Ag structure.

Then, Mg and Ag were vacuum-deposited in a weight ratio of 5:1 to a thickness of 100 Å on another glass substrate to form a Mg/Ag layer, and then Ag was vacuum-deposited to a thickness of 150 Å on the Mg/Ag layer so as to form a cathode having a (Mg/Ag)/Ag structure.

Figure 3:
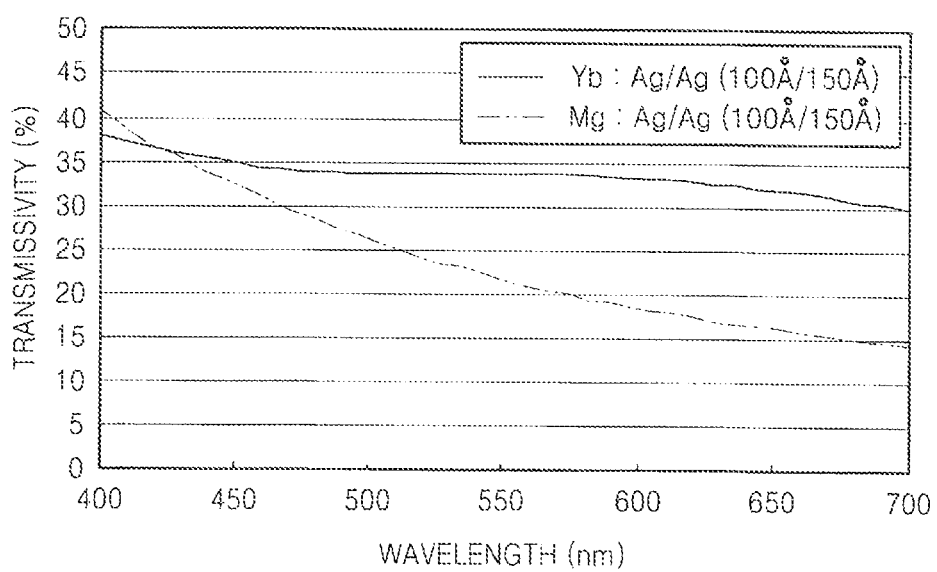
FIG. 3 is a graph showing transmissivity results of (Mg/Ag)/Ag and (Yb/Ag)/Ag layers at the same thickness according to wavelength.

The transmissivity of the (Mg/Ag)/Ag cathode and the (Yb/Ag)/Ag cathode was compared at the same thickness, and the results of the comparison are shown in FIG. 3. FIG. 3 is a graph showing transmissivity results of the (Mg/Ag)/Ag and (Yb/Ag)/Ag cathodes at the same thickness according to wavelength. Referring to FIG. 3, the (Mg/Ag)/Ag cathode has 22% transmissivity and the (Yb/Ag)/Ag cathode has 34% transmissivity at a wavelength of 550 nm. The variation in transmissivity of the (Yb/A g)/Ag cathode is relatively low. i.e. 8%, in the entire visible light region, but the variation in transmissivity of the (Mg/Ag)/Ag cathode is relatively high, i.e. 25%, in the entire visible light region. Such a small variation in transmissivity of the Yb:Ag/Ag cathode indicates that the problem of a small viewing angle can be overcome.

Example 3

Comparing Characteristics of Cathodes

The transmissivity and resistance were measured according to thicknesses of a Yb/Ag layer and a Ag layer, after fixing a weight ratio of the Yb/Ag layer at 5:1.

The weight ratio of the Yb/Ag layer was fixed at 5:1, and Yb/Ag and Ag were vacuum-deposited on a glass substrate respectively to thicknesses of 110 Å/180 Å, 110 Å/200 Å, 90 Å/180 Å, and 90 Å/200 Å so as to form (Yb/Ag)/Ag cathodes.

Mg and Ag were vacuum-deposited on another glass substrate at a weight ratio of 5:1 and to a thickness of 170 Å so as to form a Mg/Ag cathode.

Figure 4:
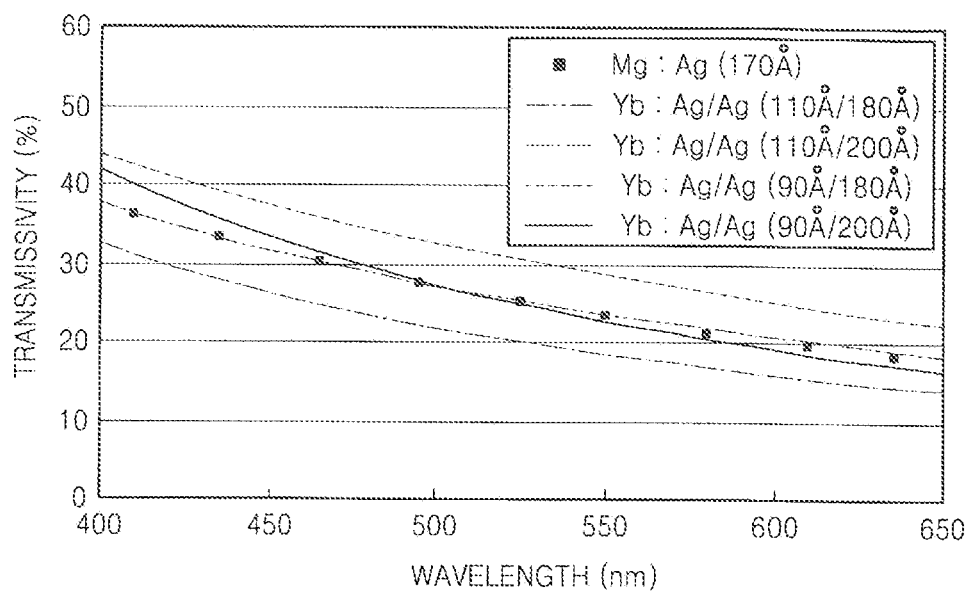
FIG. 4 is a graph showing transmissivity results according to thicknesses of a first metal layer and a second metal layer, when a ratio of metals of the first metal layer is fixed at 5:1, with respect to wavelength.

The transmissivity of each of the (Yb/Ag)/Ag cathodes and the Mg/Ag cathode were measured, and the results of the measurements are shown in FIG. 4. FIG. 4 is a graph showing transmissivity results according to thicknesses of the layers of the (Yb/Ag)/Ag cathodes and the Mg/Ag cathode, when a weight ratio of the Yb/Ag layers was fixed at 5:1, with respect to wavelength.

Referring to FIG. 4, as the thickness of the Ag layer increases, the transmissivity decreases, and the transmissivity of the (Yb/Ag)/Ag cathode is higher than that of the Mg/Ag cathode in the entire wavelength region, when the thicknesses of the Yb/Ag layer and the Ag layer are respectively 90 Å and 180 Å.

The resistances of the (Yb/Ag)/Ag cathodes were measured, and the results of the measurements are shown in Table 1 below.

TABLE 1

| (Yb/Ag)/Ag | R($\Omega$/sq) |
|---|---|
| 110 Å/180 Å | 2.7 |
| 110 Å/200 Å | 2.4 |
| 90 Å/180 Å | 2.0 |
| 90 Å/200 Å | 1.6 |

Referring to Table 1, a resistance characteristic improves when the thickness of the Yb/Ag layer is relatively low and the thickness of the Ag layer is relatively high. Specifically, the resistance is 1.6 ohm/sq when the thickness of the Yb/Ag layer is 90 Å and the thickness of the Ag layer is 200 Å.

Example 4

Comparing Transmissivity According to Thickness of Oxide Layers

Yb and Ag were vacuum-deposited on a glass substrate at a ratio of 5:1 to a thickness of 65 Å to form a Yb/Ag layer, and then Ag was vacuum-deposited on the Yb/Ag layer respectively to thicknesses of 180 Å and 250 Å so as to prepare structures of Yb/Ag (5:1, 65 Å)/Ag (180 Å) and Yb/Ag (5:1, 65 Å)/Ag (250 Å). Then, $MoO_x$ was vacuum-deposited on the structures of Yb/Ag (5:1, 65 Å)/Ag (180 Å) and Yb/Ag (5:1, 65 Å)/Ag (250 Å) so as to form structures of Yb/Ag (5:1, 65 Å)/Ag (180 Å), Yb/Ag (5:1, 65 Å)/Ag (180 Å)/$MoO_x$ (350 Å), and Yb/Ag (5:1, 65 Å)/Ag (250 Å)/$MoO_x$ (650 Å), wherein x is in a range of 2 to 4.

Mg and Ag were vacuum-deposited on another glass substrate at a ratio of 5:1 to a thickness of 180 Å to form a Mg/Ag layer, and then $MoO_x$ was vacuum-deposited on the Mg/Ag layer so as to form structures of Mg/Ag (5:1, 180 Å) and Mg/Ag (5:1, 180 Å)/MoO$_x$ (600 Å), wherein x is in a ratio of 2 to 4.

Figure 5:
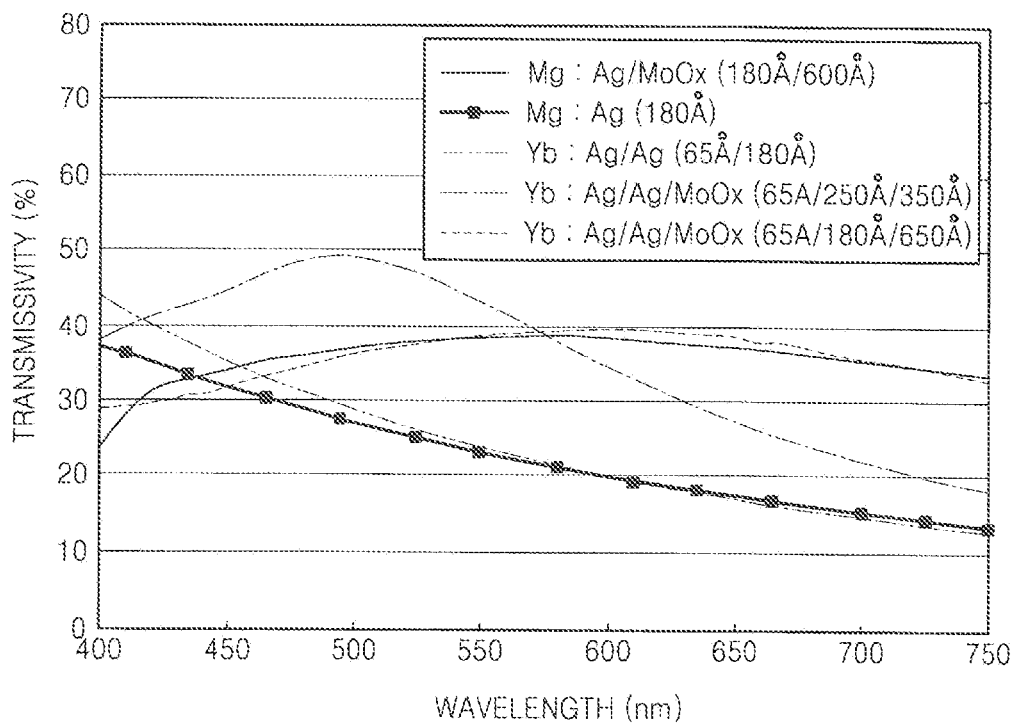
FIG. 5 is a graph showing transmissivity results according to a thickness of an oxide layer, a nitride layer, or a nitric oxide layer, with respect to wavelength.

The transmissivity of each of the structures of Mg/Ag (5:1, 180 Å), Mg/Ag (5:1, 180 Å)/MoO$_x$ (600 Å), Yb/Ag (5:1, 65 Å)/Ag (180 Å), Yb/Ag (5:1, 65 Å)/Ag (180 Å)/MoO$_x$ (350 Å), and Yb/Ag (5:1, 65 Å)/Ag (250 Å)/MoO$_x$ (650 Å) was measured, and the results of the measurements are shown in FIG. 5. FIG. 5 is a graph showing transmissivity results according to the thickness of each of the structures described above, with respect to wavelength.

Referring to FIG. 5, when the thickness of the MoO$_x$ layer is 350 Å, the transmissivity remarkably changes, but when the thickness of the MoO$_x$ layer is 650 Å, the transmissivity is in a range of 30 to 40% in the entire wavelength region.

Example 5

First Metal Layer (Yb/Ag)/Second Metal Layer Ag

ITO/Ag/ITO/HIL/HTL/blue EML/ETL/EIL/(Yb/Ag) (5:1, 100 Å)/Ag (200 Å)/MoO$_x$ (500 Å), wherein x is in a range of 2 to 4.

An anode was prepared by cutting a Corning 15 Ω/cm² (1200 Å) ITO glass substrate in a size of 50 mm×50 mm×0.7 mm, cleaning the cut ITO glass substrate respectively in isopropyl alcohol and pure water each for 5 minutes by using ultrasonic waves, and then cleaning the resultant for 30 minutes by using UV ozone. A hole injection layer having a thickness of 750 Å was formed by vacuum-depositing m-MTADTA on the ITO glass substrate. Then, a hole transport layer was formed by vacuum-depositing α-NPD on the hole injection layer to a thickness of 150 Å. After forming the hole transport layer, a light emitting layer was formed to a thickness of 300 Å by vacuum depositing 3% of TBPe as a dopant and DSA as a host on the hole transport layer. Then, an electron transport layer having a thickness of 200 Å was formed by vacuum-depositing Alq3 on the light emitting layer. LiF was vacuum-deposited on the electron transport layer to a thickness of 80 Å, thereby forming an electron injection layer.

Finally, a cathode was formed by vacuum-depositing Yb/Ag (5:1, 100 Å)/Ag (200 Å) MoO$_x$ (500 Å) on the electron injection layer, wherein x is in a range of 2 to 4, thereby completing the manufacture of an organic light emitting device.

Example 6

First Metal Layer (Y/Ag)/Second Metal Layer Al/Capping Layer WO$_3$

An organic light emitting device was prepared in the same manner as Example 5, except that a Y/Ag layer was used as a first metal layer instead of a Yb/Ag layer, a Al layer was used as a second metal layer instead of a Ag layer, and a WO$_3$ layer was used as a capping layer.

Example 7

First Metal Layer (Y/Ag)/Second Metal Layer Cu/Capping Layer WO$_3$

An organic light emitting device was prepared in the same manner as Example 5, except that a Y/Ag layer was used as a first metal layer instead of a Yb/Ag layer, a Cu layer was used as a second metal layer instead of a Ag layer, and WO$_3$ was used as a capping layer.

Example 8

First Metal Layer (Y/Ag)/Second Metal Layer Cr/Capping Layer WO$_3$

An organic light emitting device was prepared in the same manner as Example 5, except that a Y/Ag layer was used as a first metal layer instead of a Yb/Ag layer, a Cr layer was used as a second metal layer instead of a Ag layer, and WO$_3$ was used as a capping layer.

Comparative Example

An organic light emitting device was prepared in the same manner as Example 5, except that Mg/Ag (5:1, 180 Å)/Alq3 (600 Å) was used as a cathode.

Comparing Characteristics of Organic Light Emitting Devices

Figure 6:
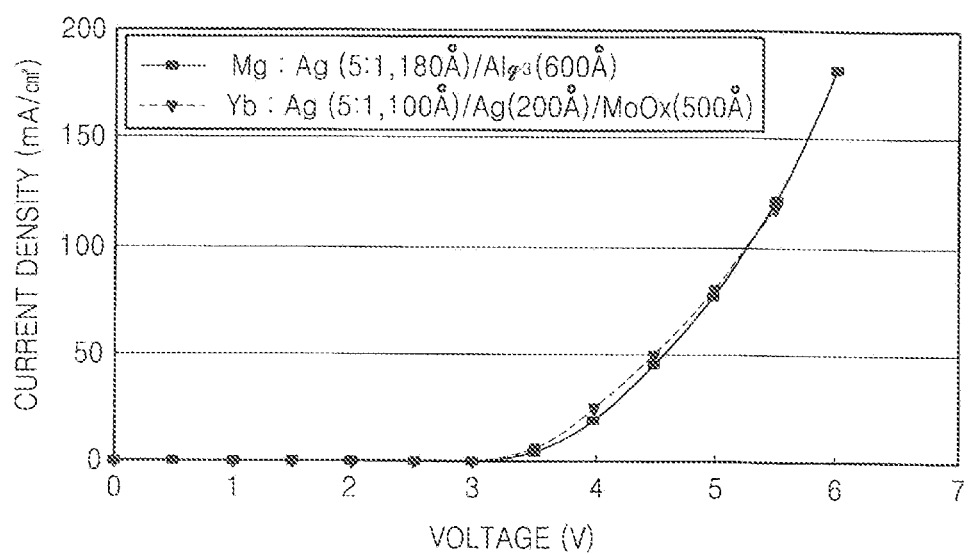
FIG. 6 is a graph showing current density according to voltage with respect to organic light emitting devices of Example 5 and the Comparative Example.

Current density according to voltage in each of the organic light emitting devices of Example 5 and the Comparative Example was measured, and the results of measurement are shown in FIG. 6. FIG. 6 is a graph showing current density according to voltage with respect to the organic light emitting devices of Example 5 and the Comparative Example.

Referring to FIG. 6, the organic light emitting devices of Example 5 and the Comparative Example have almost the same current-voltage characteristics. The organic light emitting device of Example 5 shows similar efficiency characteristics as the organic light emitting device of the Comparative Example in the vicinity of 50 mA/cm², where the required brightness is realized, and specifically, the organic light emitting device maintains high efficiency even at high current density. Accordingly, a low resistance cathode according to an embodiment of the present invention has high thin film stability compared to a conventional cathode.

Meanwhile, the resistance of the cathode according to Example 5 is 1.8 ohm/sq.

Also, according to a result of measuring current density with respect to voltage, the organic light emitting devices of Examples 6 through 8 have almost the same current-voltage characteristics as the organic light emitting device of the Comparative Example.

A cathode of an organic light emitting device according to an embodiment of the present invention has excellent transmissivity and low resistance, and thus has an excellent viewing angle when used in a wide area display.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. An organic light emitting device comprising:
an anode;
a cathode; and
a light emitting layer disposed between the anode and the cathode,
the cathode having a structure comprising a first metal layer, a second metal layer, and a capping layer selected from the group consisting of MoOx, Al$_2$O$_3$, Sb$_2$O$_3$, BaO, CdO, CaO, Ce$_2$O$_3$, CoO, Cu$_2$O, DyO, GdO, HfO$_2$, La$_2$O$_3$, Li$_2$O, MgO, NbO, NiO, Nd$_2$O$_3$, PdO, Sm$_2$O$_3$,

ScO, $SiO_2$, SrO, $Ta_2O_3$, TiO, $WO_3$, $VO_2$, YbO, $Y_2O_3$, ZnO, ZrO, wherein x is in a range of 2 to 4, a nitride layer, and a nitric oxide layer, wherein a metal of the second metal layer is Ag, and the first metal layer is an alloy of Ag and Yb, and wherein a weight ratio of Yb to Ag in the first metal layer is approximately 0.1:1 to approximately 15:1.

2. The organic light emitting device of claim 1, wherein a weight ratio of the Yb to Ag in the first metal layer is approximately 4:1 to approximately 10:1.

3. The organic light emitting device of claim 1, wherein the first metal layer has a thickness in a range of about 60 Å to about 100 Å.

4. The organic light emitting device of claim 1, wherein the second metal layer has a thickness in a range of about 50 Å to about 500 Å.

5. The organic light emitting device of claim 1, wherein the second metal layer has a thickness in a range of about 100 Å to about 300 Å.

6. The organic light emitting device of claim 1, wherein the refractive index of the capping layer is in a range of about 1.5 to about 2.5.

7. The organic light emitting device of claim 1, wherein the refractive index of the capping layer is in a range of about 1.7 to about 2.2.

8. The organic light emitting device of claim 1, wherein the thickness of the capping layer is in a range of about 100 Å to about 1500 Å.

9. The organic light emitting device of claim 1, wherein the thickness of the capping layer is in a range of about 300 Å to about 700 Å.

10. The organic light emitting device of claim 1, wherein the capping layer comprises at least one selected from the group consisting of AlN, BN, NbN, SiN, TaN, TiN, VN, YbN, and ZrN.

11. The organic light emitting device of claim 1, wherein the capping layer comprises SiON or AlON.

* * * * *